United States Patent
Chen

(10) Patent No.: US 9,343,807 B2
(45) Date of Patent: May 17, 2016

(54) ANTENNA SYSTEM FOR RECEIVING AND TRANSMITTING WIRELESS SIGNALS

(71) Applicant: RichWave Technology Corp., Taipei (TW)

(72) Inventor: Chih-Sheng Chen, Taipei (TW)

(73) Assignee: RichWave Technology Corp., Neihu District, Taipei (TW)

( * ) Notice: Subject to any disclaimer, the term of this patent is extended or adjusted under 35 U.S.C. 154(b) by 286 days.

(21) Appl. No.: 13/923,385

(22) Filed: Jun. 21, 2013

(65) Prior Publication Data
US 2013/0342398 A1    Dec. 26, 2013

(30) Foreign Application Priority Data
Jun. 21, 2012    (TW) .............................. 101122192 A

(51) Int. Cl.
| | |
|---|---|
| *H01Q 1/50* | (2006.01) |
| *H01Q 3/24* | (2006.01) |
| *H04B 1/44* | (2006.01) |
| *H03H 7/46* | (2006.01) |

(52) U.S. Cl.
CPC ................. *H01Q 3/247* (2013.01); *H04B 1/44* (2013.01); *H03H 7/461* (2013.01)

(58) Field of Classification Search
CPC .................................. H01Q 3/24; H01Q 3/247
USPC .......................................... 343/850, 852, 876
See application file for complete search history.

(56) References Cited

U.S. PATENT DOCUMENTS

| | | | |
|---|---|---|---|
| 6,862,441 B2 | 3/2005 | Ellä | |
| 7,109,825 B2 | 9/2006 | Song | |
| 7,865,159 B2* | 1/2011 | Dean | H04B 7/15535 375/213 |
| 2004/0242165 A1 | 12/2004 | Jedeloo | |
| 2008/0305750 A1* | 12/2008 | Alon | H01Q 9/0485 455/77 |
| 2010/0003941 A1* | 1/2010 | Kojima | H04B 1/48 455/269 |
| 2010/0260082 A1 | 10/2010 | Lum | |
| 2012/0142286 A1* | 6/2012 | Mitomo | H01Q 3/24 455/82 |

FOREIGN PATENT DOCUMENTS

CN    202435391 U    9/2012

* cited by examiner

*Primary Examiner* — Dameon E Levi
*Assistant Examiner* — Collin Dawkins
(74) *Attorney, Agent, or Firm* — Winston Hsu; Scott Margo

(57) ABSTRACT

An antenna system includes an antenna and N integrated passive components (IPCs). A first end of each IPC of the N IPCs is directly coupled to the antenna for receiving signals of a band corresponding to the IPC and filtering signals of bands corresponding to other IPCs of the N IPCs. The antenna system can prevent signals of various bands from interfering with each other, reduces parasitic effect, and further improves nonlinear distortion.

15 Claims, 4 Drawing Sheets

ANTENNA SYSTEM FOR RECEIVING AND TRANSMITTING WIRELESS SIGNALS

BACKGROUND OF THE INVENTION

1. Field of the Invention

The present invention relates to an antenna system for receiving and transmitting wireless signals, especially relating to an antenna system capable of improving nonlinear distortion of signals.

2. Description of the Prior Art

When a practical antenna system is transmitting signals, a certain amount of power distortion is inevitable. For example, an antenna system transmits a 1 dBm (decibel milliwatt) signal, if power loss of the antenna system is 0.5 dBm, output signal of the antenna system will be 0.5dBm. However, nonlinear distortion may occur in antenna systems when transmitting higher power output signals. For example, when the antenna system transmits a 10 dBm signal, the power loss is increased to 1.5 dBm from the former 0.5 dBm, thus the output signal will be 8.5 dBm. This causes distortions to occur in signals.

FIG. 1 is a diagram showing curves of output power relative to input power of antenna systems, wherein the inclined dotted line represents a curve without distortion of output power (Pout) relative to input power (Pin), and the solid line represents a curve with distortion of Pout relative to Pin. When the difference between Pout without distortion and Pout with distortion reaches 1 dBm, the corresponding Pin is so-called P1dBm. When a signal's Pin reaches P1dBm, distortion of its output signal could be severe. Therefore, distortion extent of output signal can be determined when Pin reaches P1dBm. Besides, if P1dBm is enhanced with reduced interference and parasitic effects, Pout will reach P1dBm point until higher power, thus improving nonlinear distortion of the signal.

Integrated Passive Components (IPCs) are attracting an increasing interest due to needs of handheld wireless devices to decrease in size and cost and increase in functionality. Many functional blocks such as impedance matching circuits, harmonic filters, couplers, baluns and power combiner/divider can be realized by IPCs technology. IPCs are generally fabricated using standard wafer fab technologies such as thin film and photolithography processing.

SUMMARY OF THE INVENTION

An embodiment of the present invention relates to an antenna system for receiving and transmitting wireless signals. The antenna system includes an antenna and N integrated passive components (IPCs). A first end of each IPC of the N IPCs is directly coupled to the antenna, for receiving signals of a band corresponding to the IPC from the antenna and filtering signals of bands corresponding to other IPCs of the N IPCs. N is an integer larger than 1.

Another embodiment of the present invention relates to an antenna system for receiving and transmitting wireless signals. The antenna system includes an antenna, M receiving switches, and an IPC. A first end of each of the M receiving switches is directly coupled to the antenna for receiving signal from the antenna by turning on the switch. The IPC has a first end directly coupled to the antenna, for receiving signals corresponding to a band of the IPC from the antenna and filtering signals of bands corresponding to the M receiving switches. M is a positive integer.

Another embodiment of the present invention relates to an antenna system for receiving and transmitting wireless signals. The antenna system includes an antenna, M receiving switches, and N IPCs. A first end of each of the M receiving switches is directly coupled to the antenna, for receiving signal from the antenna by turning on the switch. A first end of each IPC of the N IPCs is directly coupled to the antenna, for receiving signals of a band corresponding to the IPC from the antenna and filtering signals of bands corresponding to other IPCs of the N IPCs and the M receiving switches. M is a positive integer, and N is an integer larger than 1.

Through the present inventions, a situation of signals of various bands interfering with each other can be suppressed, thus improving nonlinear distortion of the signals. Besides, parasitic capacitance effect can also be improved through the present inventions.

These and other objectives of the present invention will no doubt become obvious to those of ordinary skill in the art after reading the following detailed description of the preferred embodiment that is illustrated in the various figures and drawings.

DETAILED DESCRIPTION

Some phrases are referred to specific elements in the present specification and claims, please notice that the manufacturer might use different terms to refer to the same elements. However, the definition between elements is based on their functions instead of their names. Further, in the present specification and claims, the term "comprising" is open type and should not be viewed as the term "consisted of." Besides, the term "electrically coupled" can be referred to either directly connecting or indirectly connecting between elements.

The embodiments and figures are provided as follows in order to illustrate the present invention in detail, but please notice that the claimed scope of the present invention is not limited by the provided embodiments and figures.

Figure 1:
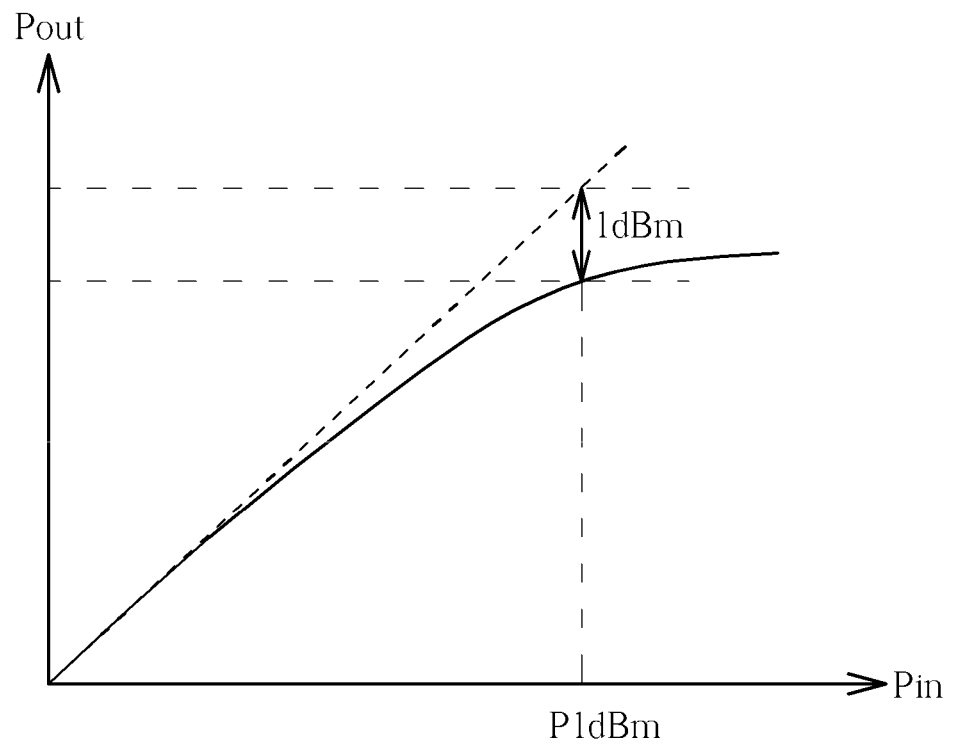
FIG. 1 is a diagram showing the curves of the output power relating to the input power of an antenna system.
Figure 2:
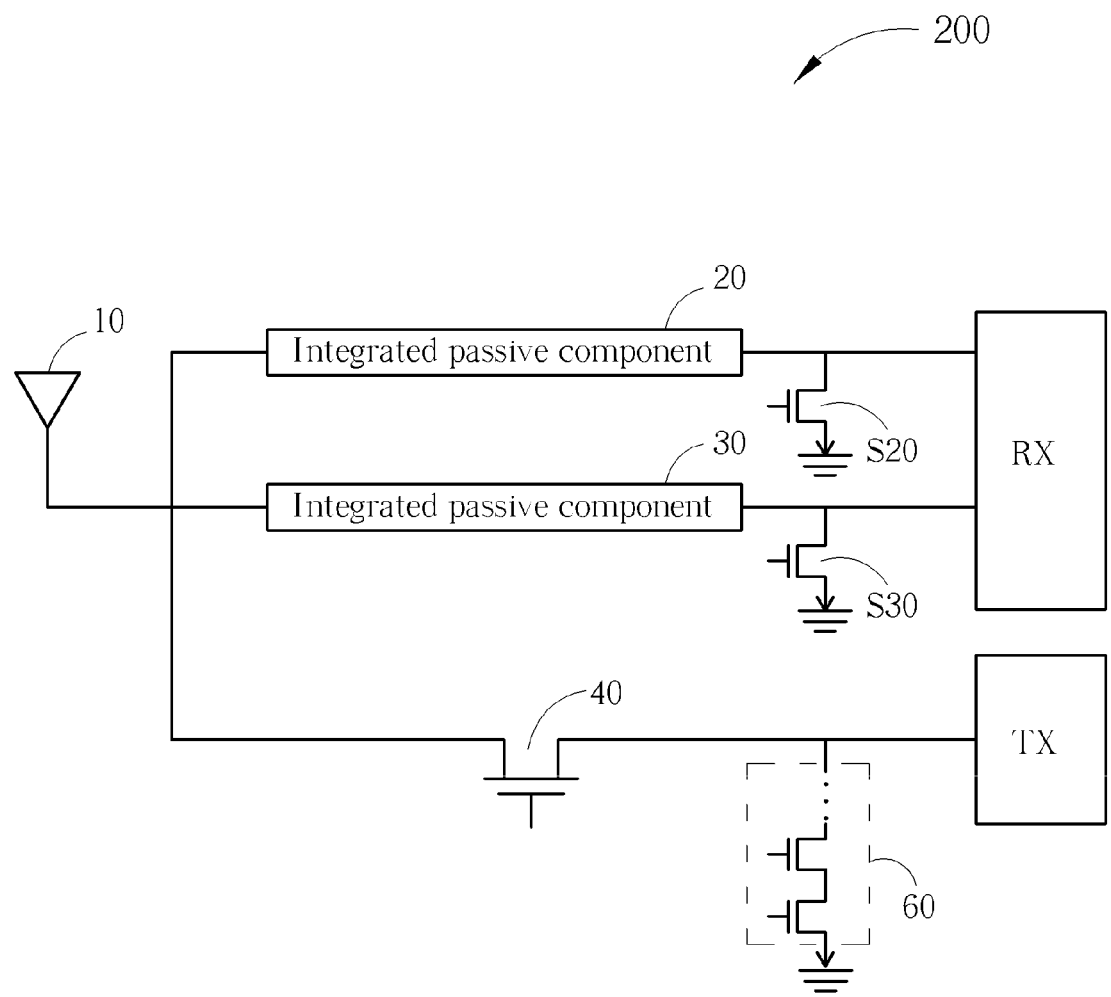
FIG. 2 shows an antenna system of a first embodiment of the present invention.

FIG. 2 shows an antenna system 200 of a first embodiment of the present invention which is used for receiving and transmitting wireless signals. Antenna system 200 includes an antenna 10, two integrated passive components (IPCs) 20 and 30, a transmitting switch 40, a receiver RX, a transmitter TX, two bypass switches S20 and S30, and a set of serially connected switches 60.

A first end of each of IPCs 20 and 30 is coupled to antenna 10 for receiving signals of a band (e.g. 2.4 G band signal) corresponding to IPC 20 or receiving signals of a band (e.g. 5 G band signal) corresponding to IPC 30 from antenna 10. When antenna 10 receives 2.4 G band signal through IPC 20, 5 G band signal is filtered by IPC 20. When antenna 10 receives 5 G band signal through IPC 30, 2.4 G band signal is filtered by IPC 30. A first end of transmitting switch 40 is coupled to antenna 10, when transmitting switch 40 is turned on, transmitter TX will transmit signals to antenna 10 through transmitting switch 40.

Bypass switch S20 is coupled between a second end of IPC 20 and ground, and bypass switch S30 is coupled between a second end of IPC 30 and the ground. Each of turning-on impedances of bypass switches S20 and S30 is larger than ten times turning-on impedance of transmitting switch 40. Gate widths of bypass switches S20 and S30 can be configured to be much smaller than those of ordinary radio frequency (RF) switches, e.g. transmitting switch 40. Thus, bypass switches S20 and S30 have smaller areas, compared to the ordinary RF switches, and parasitic capacitance effects of switches S20 and S30 will not be significant. Moreover, the above mentioned components can be integrated into an integrated circuit (IC) to reduce the parasitic effect further.

Receiver RX is coupled to the second end of each of IPCs 20 and 30, for processing signals (e.g. 2.4 G band signal and 5 G band signal) received from IPCs 20 and 30. That is, receiver RX has a multiplexing function.

Transmitter TX is coupled to a second end of transmitting switch 40, for generating and transmitting signals to antenna 10 through transmitting switch 40.

When transmitter TX transmits 2.4 G or 5 G band signals, bypass switches S20 and S30 and transmitting switch 40 are turned on, so that 2.4 G and 5 G band signals can be transmitted by antenna 10 through transmitting switch 40. Due to bypass switches S20 and S30 being turned on, signals from IPCs 20 and 30 to receiver RX are shorted to the ground, thus receiver RX will not receive signals transmitted from transmitter TX. Further, when transmitter TX is transmitting 5 G band signal, bypass switch S20 can be optionally turned on or off. Because even bypass switch S20 is turned off, 5 G band signal will still be filtered by IPC 20, so that receiver RX will not receive 5 G band signal via IPC 20. Similarly, if transmitter TX is transmitting 2.4 G band signal, bypass switch S30 can be optionally turned on or off.

When receiver RX receives 2.4 G band signal from antenna 10 through IPC 20, bypass switch S20 and transmitting switch 40 are turned off and bypass switch S30 is turned on, so that 2.4 G band signal can be fully received by receiver RX via IPC 20 without grounding, and will not be transmitted to transmitter TX through transmitting switch 40 or be received by receiver RX through IPC 30. Similarly, when receiver RX receives 5 G band signal from antenna 10 through IPC 30, bypass switch S30 and transmitting switch 40 are turned off and bypass switch S20 is turned on.

The set of switches 60 is coupled between the second end of transmitting switch 40 and the ground, and in FIG. 2, the set of switches 60 is configured to include multiple switches connected in series. However, the present invention does not limit the amount of the switches connected in series, that is, the set of switches 60 can also be configured to include only one switch. The amount of the switches connected in series is according to the power level of transmitter TX. If transmitter TX has higher power level, the set of switches 60 may include more switches connected in series.

To be more specific, if impedances of IPCs 20 and 30 and receiver RX are all 50 ohm as designed for corresponding frequencies, when receiver RX receives 2.4 G band signal corresponding to IPC 20 received from antenna 10, the equivalent input impedances at IPC 30 and transmitting switch 40 seen from antenna 10 had better to be infinite. That is, seen from antenna 10, the IPC 30 and transmitting switch 40 need to be open-circuited, so as to prevent from interference during wireless signal transmission. Thus, transmitting switch 40 needs to be turned off. Because IPC 30 can filter 2.4 G band signal, IPC 30 can be seen as an open circuit, however, if bypass switch S30 is further turned on, 2.4 G band signal can be filtered more thoroughly. Meanwhile, an equivalent input impedance seen from antenna 10 at IPC 20 equals to the square of a characteristic impedance of IPC 20 divided by the impedance of receiver RX, thus the equivalent input impedance at IPC 20 is 50*50/50=50 ohm for good power matching at 2.4 G band.

Similarly, when receiver RX receives 5 G band signal corresponding to IPC 30 from antenna 10, seen from antenna 10, IPC 20 and transmitting switch 40 are open-circuited and an equivalent input impedance at IPC 30 equals to 50*50/50=50 ohm at 5 G band.

In the first embodiment, further, the amount of IPCs can be N, where N≥2. A first end of each IPC of N IPCs is coupled to antenna 10, for receiving signals of a band corresponding to the IPC and filtering signals of bands corresponding to other IPCs of the N IPCs. And, each bypass switch of N bypass switches is coupled between a second end of each IPC of the N IPCs and the ground. Receiver RX is coupled to the second end of each IPC of the N IPCs.

Figure 3:
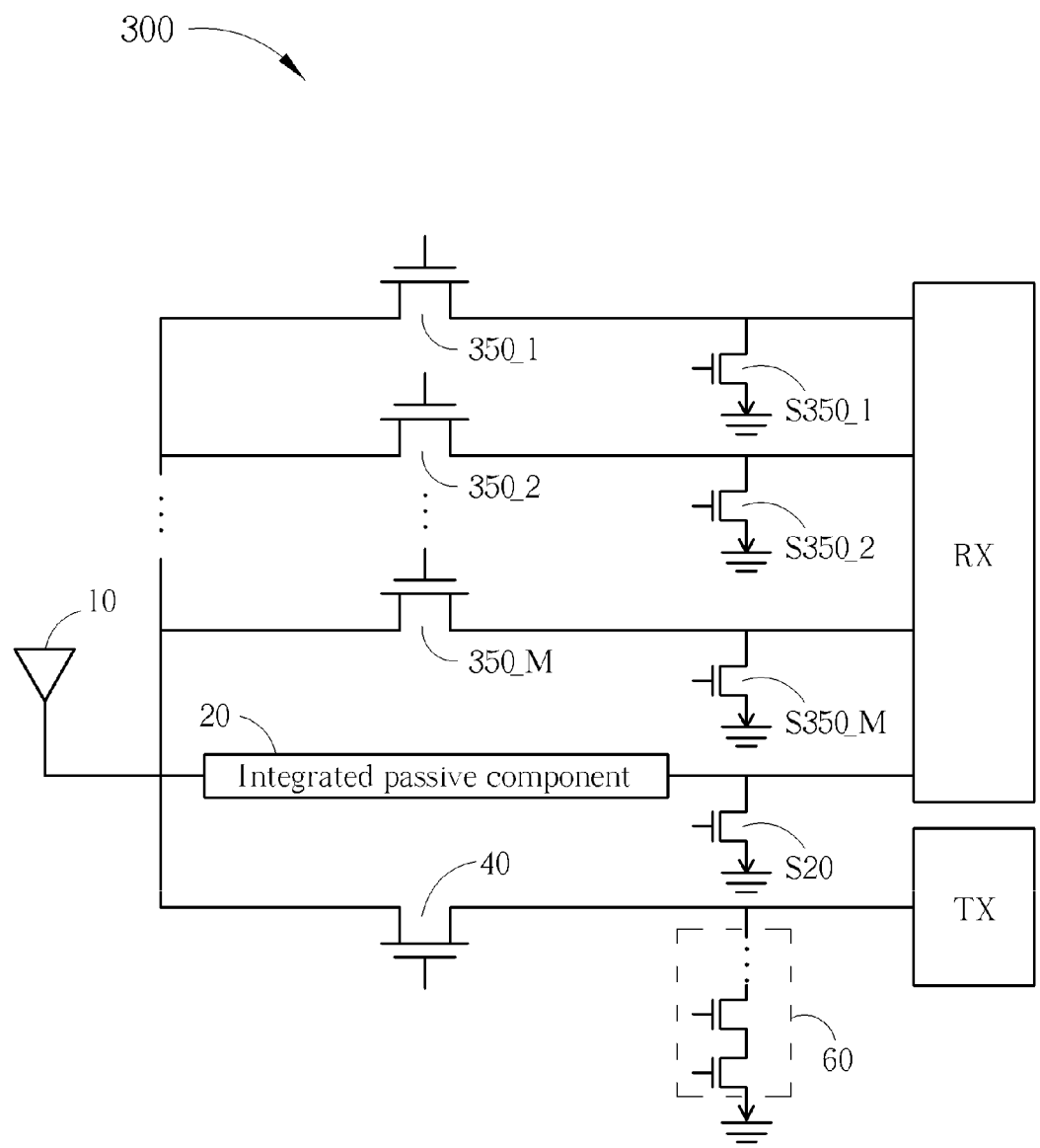
FIG. 3 shows an antenna system of a second embodiment of the present invention.

FIG. 3 shows an antenna system 300 of a second embodiment of the present invention which is used for receiving and transmitting wireless signals. Antenna system 300 includes an antenna 10, M receiving switches 350_1 to 350_M, an IPC 20, a transmitting switch 40, a receiver RX, a transmitter TX, bypass switches S20 and S350_1 to S350_M, and a set of serially connected switches 60. A first end of each receiving switch of M receiving switches 350_1 to 350_M is coupled to antenna 10 for receiving signals from antenna 10 when the receiving switch is turned on. IPC 20 has a first end coupled to antenna 10, for receiving signals of a band corresponding to IPC 20 and filtering signals of other bands corresponding to M receiving switches 350_1 to 350_M. Transmitting switch 40 has a first end coupled to antenna 10 for transmitting signals to antenna 10. M is a positive integer.

In FIG. 3, bypass switch S20 is coupled between a second end of IPC 20 and the ground, and each bypass switch of bypass switches S350_1 to S350_M is coupled between a second end of each receiving switch of M receiving switches 350_1 to 350_M and the ground. Each of turning-on impedances of bypass switches S20 and S350_1 to S350_M is larger than ten times turning-on impedance of transmitting switch 40. Besides, gate widths of bypass switches S20 and S350_1 to S350_M can be configured to be much smaller than those of ordinary RF switches, e.g. transmitting switch 40. Thus, bypass switches S20 and S350_1 to S350_M have smaller areas, compared to the ordinary RF switches, and parasitic capacitance effects of bypass switches S20 and S350_1 to S350_M will not be significant.

Receiver RX is coupled to the second ends of IPC 20 and of each receiving switch of M receiving switches 350_1 to 350_M, for processing signals received from IPC 20 and M receiving switches 350_1 to 350_M. Transmitter TX is coupled to a second end of transmitting switch 40, for generating and transmitting signals to antenna 10 through transmitting switch 40.

When transmitter TX transmits signals of a band corresponding to one of IPC 20 and M receiving switches 350_1 to 350_M, bypass switch S20 and transmitting switch 40 are turned on, and M receiving switches 350_1 to 350_M will be all turned off, so that signals can be transmitted by antenna 10 through transmitting switch 40 and signals transmitted from IPC 20 to receiver RX will be shorted to the ground. And, receiver RX will not receive signals from transmitter TX by turning off M receiving switches 350_1 to 350_M. Furthermore, bypass switches S350_1 to S350_M can be turned on to ensure that the second end of each of M receiving switches 350_1 to 350_M is shorted to the ground.

When receiver RX receives signals of a band corresponding to IPC 20 from antenna 10, bypass switch S20, transmitting switch 40, and M receiving switches 350_1 to 350_M are turned off, so that signals can be fully received by receiver RX via IPC 20 without being shorted to the ground, and will not be transmitted to transmitter TX through transmitting switch 40 or to receiver RX through M receiving switches 350_1 to 350_M. Further, bypass switches S350_1 to S350_M can also be turned on to ensure that the second end of each receiving switch of M receiving switches 350_1 to 350_M is shorted to the ground.

When receiver RX receives signals of a band corresponding to one of M receiving switches 350_1 to 350_M, e.g. 350_1, bypass switch S350_1, transmitting switch 40, and receiving switches 350_2 to 350_M are turned off, so that signals can be fully received by receiver RX via receiving switch 350_1 without being shorted to the ground, and will not be transmitted to transmitter TX through transmitting switch 40 or to receiver RX through receiving switches 350_2 to 350_M or IPC 20. Further, bypass switches S350_2 to S350_M and S20 can also be turned on to ensure that the second ends of IPC 20 and each receiving switch of receiving switches 350_2 to 350_M are shorted to the ground.

The set of switches 60 is coupled between the second end of transmitting switch 40 and the ground. Similar to the first embodiment, the set of switches 60 is configured to include multiple switches connected in series or only one switch.

Similar to the first embodiment, when antenna system 300 receives or transmits signals of a band corresponding to IPC 20 or one of M receiving switches 350_1 to 350_M, antenna system 300 can filter signals of other bands to receiver RX and all signals from transmitter TX to receiver RX to prevent signals of various bands from interfering with each other. Besides, bypass switches S350_1 to S350_M and S20 have high turning-on impedances and small gate widths, thus reducing parasitic capacitance effects. Moreover, these above mentioned components can be integrated into an IC to reduce the parasitic effect further.

Figure 4:
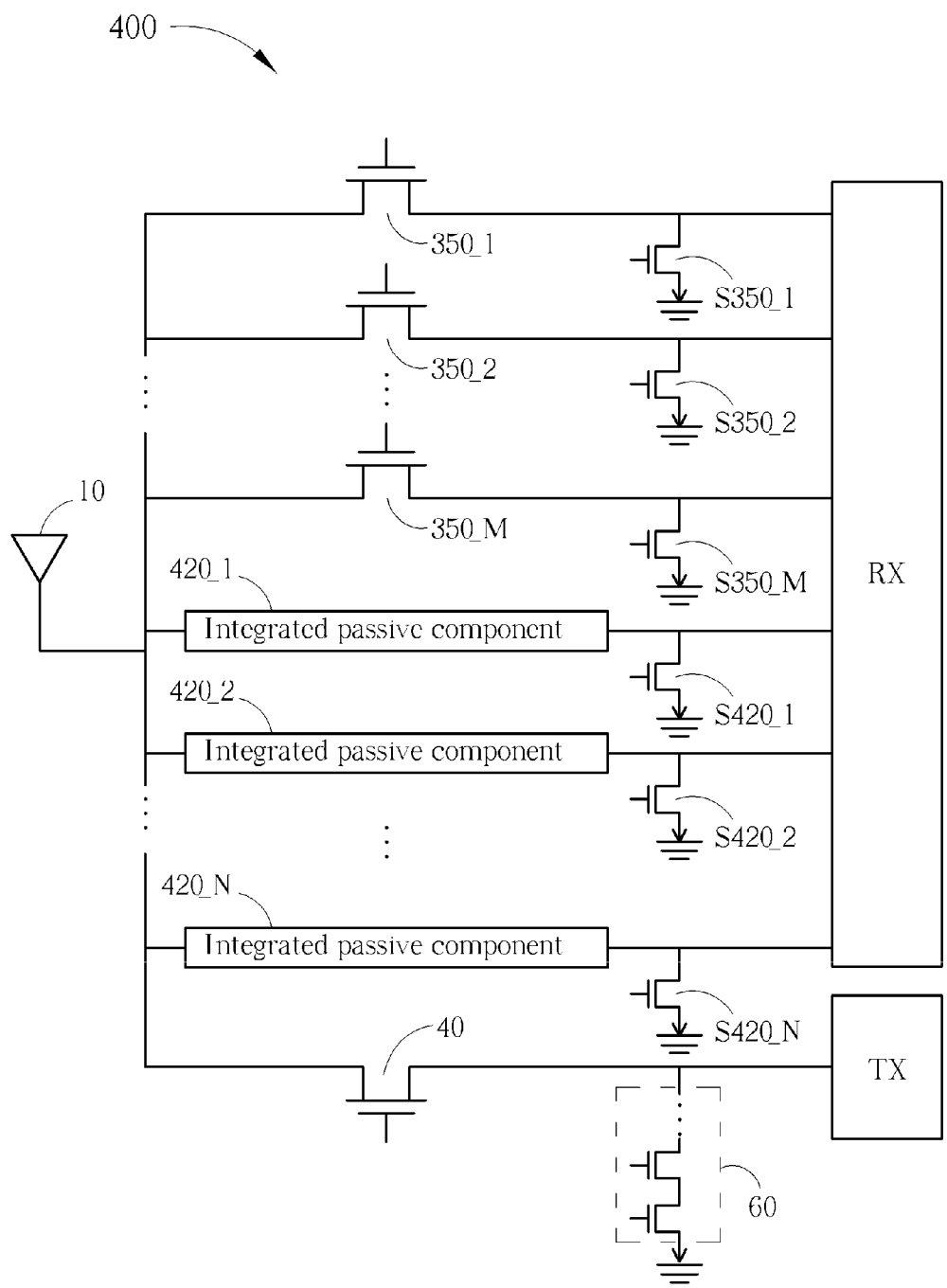
FIG. 4 shows an antenna system of a third embodiment of the present invention.

FIG. 4 shows an antenna system 400 of a third embodiment of the present invention which is used for receiving and transmitting wireless signals. Antenna system 400 includes an antenna 10, M receiving switches 350_1 to 350_M, N IPCs 420_1 to 420_N, a transmitting switch 40, bypass switches S420_1 to S420_N and S350_1 to S350_M, and a set of serially connected switches 60. A first end of each receiving switch of M receiving switches 350_1 to 350_M is coupled to antenna 10, for receiving signals from antenna 10 when the receiving switch is turned on. Each IPC of IPCs 420_1 to 420_N has a first end coupled to antenna 10, and is used for receiving signals of a corresponding band and filtering signals of bands corresponding to other IPCs of IPCs 420_1 to 420_N and receiving switches 350_1 to 350_M. Transmitting switch 40 has first end coupled to antenna 10 for transmitting signals to antenna 10. M is a positive integer, and N is an integer larger than 1.

Each bypass switch of bypass switches S350_1 to S350_M is coupled between a second end of the corresponding one of M receiving switches 350_1 to 350_M and the ground, and each bypass switch of bypass switches S420_1 to S420_N is coupled between a second end of each IPC of IPCs 420_1 to 420_N and the ground. Each of turning-on impedances of bypass switches S420_1 to S420_N and S350_1 to S350_M is larger than ten times turning-on impedance of transmitting switch 40. Besides, gate widths of bypass switches S420_1 to S420_N and S350_1 to S350_M can be configured to be much smaller than those of ordinary RF switches, e.g. transmitting switch 40. Thus, these bypass switches have smaller areas, compared to the ordinary RF switches, and parasitic capacitance effects of bypass switches S420_1 to S420_N will not be significant.

Receiver RX is coupled to the second end of each IPC of IPCs 420_1 to 420_N and of each receiving switch of receiving switches 350_1 to 350_M, for processing signals received from IPCs 420_1 to 420_N or receiving switches 350_1 to 350_M. Transmitter TX is coupled to a second end of transmitting switch 40, for generating and transmitting signals to antenna 10 through transmitting switch 40.

When transmitter TX transmits signals of a band correspond to one of IPCs 420_1 to 420_N and receiving switches 350_1 to 350_M, bypass switches S420_1 to S420_N and transmitting switch 40 are turned on, and receiving switches 350_1 to 350_M are all turned off, so that signals can be transmitted by antenna 10 through transmitting switch 40. Besides, signals via IPCs 420_1 to 420_N to receiver RX will be shorted to the ground. Thus, receiver RX will not be affected by signals transmitted from transmitter TX. Further, bypass switches S350_1 to S350_M can be turned on to ensure that the second end of each of receiving switches 350_1 to 350_M is shorted to the ground.

When receiver RX receives signals corresponding to one of IPCs 420_1 to 420_N, e.g. 420_1, from antenna 10, bypass switch S420_1, transmitting switch 40, and receiving switches 350_1 to 350_M are turned off, and bypass switches S420_2 to S420_N are all turned on, so that signals can be fully received by receiver RX via IPC 420_1 without being shorted to the ground, and will not be transmitted to transmitter TX through transmitting switch 40 or to receiver RX through IPCs 420_2 to 420_N and receiving switches 350_1 to 350_M. Besides, bypass switches S350_1 to S350_M can also be turned on to ensure that the second end of each receiving switch of receiving switches 350_1 to 350_M is shorted to the ground.

When receiver RX is receiving signals of a band corresponding to one receiving switch of receiving switches 350_1 to 350_M, e.g. receiving switch 350_1, bypass switch S350_1, transmitting switch 40, and receiving switches 350_2 to 350_M are turned off, and bypass switches S420_1 to S420_N are turned on, so that signals can be fully received by receiver RX via receiving switches 350_1 without being shorted to the ground, and will not be transmitted to transmitter TX through transmitting switch 40 or to receiver RX through IPCs 420_1 to 420_N and receiving switches 350_2 to 350_M. Besides, bypass switches S350_2 to S350_M can also be turned on to ensure that the second end of each receiving switch of receiving switches 350_2 to 350_M is shorted to the ground.

The set of switches 60 is coupled between the second end of transmitting switch 40 and the ground. Similar to the first embodiment, the set of switches 60 is configured to include multiple switches connected in series or only one switch.

Similar to the first embodiment, in the third embodiment, when antenna system 400 is receiving or transmitting wireless signals of one band corresponding to one of IPCs 420_1 to 420_N and receiving switches 350_1 to 350_M, antenna system 400 can filter signals of other bands to receiver RX and all signals from transmitter TX to receiver RX to prevent signals of various bands from interfering with each other and improve nonlinear distortion. Besides, bypass switches S420_1 to S420_N and S350_1 to S350_M have high turning-on impedances and small gate widths, thus reducing parasitic capacitance effects. Moreover, these above mentioned components can be integrated into an IC to reduce the parasitic effect further.

In view of above, through utilizing antenna systems 200 to 400 of the embodiments of the present invention, the situation of signals of various bands interfering with each other can be suppressed and parasitic effect can be reduced with IPC technology and small bypass switch, thus improving nonlinear distortion of signals.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An antenna system for receiving and transmitting wireless signals, comprising:
   an antenna;
   N integrated passive components, wherein a first end of each integrated passive component of the N integrated passive components is directly coupled to the antenna, for receiving signals of a band corresponding to the integrated passive component and filtering signals of bands corresponding to other integrated passive components of the N integrated passive components, wherein when the integrated passive component of the N integrated passive components receives the signals of the band corresponding to the integrated passive component, equivalent input impedance values at other integrated passive components of the N integrated passive components seen from the antenna are infinite; and
   N bypass switches, wherein each bypass switch of the N bypass switches is coupled between a second end of the corresponding one of the N integrated passive components and ground;
   wherein N is an integer larger than 1.

2. The antenna system of claim 1, further comprising a transmitting switch having a first end coupled to the antenna for transmitting signals to the antenna when the transmitting switch is turned on.

3. The antenna system of claim 2,
   wherein each of turning-on impedances of the N bypass switches is larger than ten times turning-on impedance of the transmitting switch.

4. The antenna system of claim 2, further comprising:
   a set of serially connected switches coupled between a second end of the transmitting switch and ground.

5. The antenna system of claim 2, further comprising:
   a receiver, coupled to a second end of each integrated passive component of the N integrated passive components, for processing signals from the N integrated passive components; and
   a transmitter, coupled to a second end of the transmitting switch, for generating and transmitting signals to the antenna through the transmitting switch.

6. An antenna system for receiving and transmitting wireless signals, comprising:
   an antenna;
   M receiving switches, wherein a first end of each receiving switch of the M receiving switches is coupled to the antenna for receiving signals from the antenna when the receiving switch is turned on;
   an integrated passive component having a first end directly coupled to the antenna, for receiving signals of a band corresponding to the integrated passive component from the antenna and filtering signals of bands corresponding to the M receiving switches; and
   an auxiliary bypass switch coupled between a second end of the integrated passive component and ground;
   wherein when the integrated passive component receives the signals of the band corresponding to the integrated passive component, the M receiving switches are turned off and equivalent input impedance values at the M receiving switches seen from the antenna are infinite, and when the receiving switch of the M receiving switches receives signals of a band corresponding to the receiving switch of the M receiving switches, equivalent input impedance values at other receiving switches of the M receiving switches and the integrated passive component seen from the antenna are infinite;
   wherein M is a positive integer.

7. The antenna system of claim 6, further comprising:
   a transmitting switch having a first end coupled to the antenna for transmitting signals to the antenna.

8. The antenna system of claim 7, further comprising:
   M first bypass switches, wherein each first bypass switch of the M first bypass switches is coupled between a second end of the corresponding one of the M receiving switches and ground;
   wherein each of turning-on impedances of the M first bypass switches and the auxiliary bypass switch is larger than ten times turning-on impedance of the transmitting switch.

9. The antenna system of claim 8, further comprising:
   a set of serially connected switches coupled between a second end of the transmitting switch and the ground.

10. The antenna system of claim 7, further comprising:
    a receiver coupled to a second end of the integrated passive component and a second end of each receiving switch of the M receiving switches, for processing signals from the integrated passive component and the M receiving switches; and
    a transmitter, coupled to a second end of the transmitting switch, for generating and transmitting signals to the antenna through the transmitting switch.

11. An antenna system for receiving and transmitting wireless signals, comprising:
    an antenna;
    M receiving switches, wherein a first end of each receiving switch of the M receiving switches is coupled to the antenna, for receiving signals from the antenna when the receiving switch is turned on;
    N integrated passive components, wherein a first end of each integrated passive component of the N integrated passive components is directly coupled to the antenna, for receiving signals of a band corresponding to the integrated passive component and filtering signals of bands corresponding to other integrated passive components of the N integrated passive components and the M receiving switches; and
    N auxiliary bypass switches, wherein each auxiliary bypass switch of the N auxiliary bypass switches is coupled between a second end of the corresponding one of the N integrated passive components and ground;
    wherein when the integrated passive component of the N integrated passive components receives the signals of the band corresponding to the integrated passive component, the M receiving switches are turned off and equivalent input impedance values at the M receiving switches and other integrated passive components of the N integrated passive components seen from the antenna are infinite, and when the receiving switch of the M receiving switches receives signals of a band corresponding to the receiving switch of the M receiving switches, other receiving switches of the M receiving switches are turned off and equivalent input impedance values at the other receiving switches of the M receiving switches and the N integrated passive components seen from the antenna are infinite;

wherein M is a positive integer, and N is an integer larger than 1.

12. The antenna system of claim 11, further comprising:
a transmitting switch having a first end coupled to the antenna for transmitting signals to the antenna.

13. The antenna system of claim 12, further comprising:
M first bypass switches, wherein each first bypass switch of the M first bypass switches is coupled between a second end of the corresponding one of the M receiving switch and ground;
wherein each of turning-on impedances of the M first bypass switches and the N auxiliary bypass switches is larger than ten times turning-on impedance of the transmitting switch.

14. The antenna system of claim 12, further comprising:
a set of serially connected switches coupled between a second end of the transmitting switch and ground.

15. The antenna system of claim 12, further comprising:
a receiver coupled to a second end of each integrated passive component of the N integrated passive components and a second end of each receiving switch of the M receiving switches, for processing signals received from the N integrated passive components and the M receiving switches; and
a transmitter, coupled to a second end of the transmitting switch, for generating and transmitting signals to the antenna through the transmitting switch.

* * * * *